United States Patent
Garrett

(10) Patent No.: US 6,437,026 B1
(45) Date of Patent: Aug. 20, 2002

(54) HARDENER FOR EPOXY MOLDING COMPOUNDS

(75) Inventor: David William Garrett, Marietta, GA (US)

(73) Assignee: Cookson Singapore PTE Ltd. (SG)

( * ) Notice: Subject to any disclaimer, the term of this patent is extended or adjusted under 35 U.S.C. 154(b) by 0 days.

(21) Appl. No.: 09/755,510

(22) Filed: Jan. 5, 2001

(51) Int. Cl.[7] .............................. C08K 3/10; C08L 63/02
(52) U.S. Cl. ..................... 523/458; 523/465; 523/466; 525/523; 528/118; 528/418
(58) Field of Search ................................. 523/458, 465, 523/466; 525/523; 528/118, 418

(56) References Cited

U.S. PATENT DOCUMENTS

| | | | |
|---|---|---|---|
| 4,719,253 A | | 1/1988 | Turpin et al. ............... 523/403 |
| 5,298,548 A | * | 3/1994 | Shiobara .................... 523/443 |
| 6,207,786 B1 | * | 3/2001 | Ishida ......................... 528/94 |

FOREIGN PATENT DOCUMENTS

| | | |
|---|---|---|
| EP | 0 149 987 A2 | 7/1985 |
| EP | 0 789 056 A2 | 8/1997 |
| JP | 11-60898 A | 3/1999 |
| JP | 11-140278 A | 5/1999 |

OTHER PUBLICATIONS

Encyclopedia of Polymer Science and Technology John Wiley and Sons, pp. 285 and 286, 1986.*

Patent Abstracts of Japan, Publication No. 11–140278 (May 25, 1999) (Application No.: 09–310975); Title: "Resin Composition for Semiconductor Sealing and Resin–Sealed Type Semiconductor Device Sealed with the Composition".

Patent Abstracts of Japan, Publication No. 11–060898 (Mar. 5, 1999) (Application No.: 09–230820); Title: "Semiconductor Molding Resin Composition and Resin Molded Type Semiconductor".

Patent Abstracts of Japan, Publication No. 10–259248 (Sep. 29, 1998) (Application No.: 09–112864); Title: "Thermosetting Composition and its Hardened Material".

Patent Abstracts of Japan, Publication No. 10–244623 (Sep. 14, 1998) (Application No.: 09–052957); Title: "Laminated Sheet for Printed Wiring Board".

* cited by examiner

*Primary Examiner*—Robert Dawson
*Assistant Examiner*—D. Aylward
(74) *Attorney, Agent, or Firm*—Mintz, Levin, Cohn, Ferris, Glovsky and Popeo, P.C.

(57) ABSTRACT

The invention is directed to novel epoxy molding compounds for the encapsulation of microchips in the electronics industry. Known epoxy molding encapsulants are generally prepared from a blend epoxy resins, phenol hardeners, silica fillers, catalysts, flame retardant materials, processing aids and colorants. The addition of polybenzoxazines as a co-reactant with one or several epoxy resins provides a product with reduced moisture adsorption while maintaining a high glass transition temperature.

25 Claims, No Drawings

HARDENER FOR EPOXY MOLDING COMPOUNDS

FIELD OF THE INVENTION

The present invention is in the field of epoxy molding compounds for encapsulation of microchips in the electronics industry. More specifically, the present invention is directed to an epoxy molding compound in which polybenzoxazines are employed as a co-reactant with one or several epoxy resins.

BACKGROUND OF THE INVENTION

Epoxy molding compounds for encapsulation of microchips in the electronics industry are generally prepared from a blend of epoxy resins, phenol hardeners, silica fillers, catalysts, flame retardant materials, processing aids, and colorants. Such epoxy moldings are known in the art and are described for example in U.S. Pat. No. 4,719,253, EP 149987 and EP 789056. Unfortunately, these products do not meet new solder reflow conditions in the manufacture of epoxy molding compounds for encapsulation of microchips. The prior art epoxy moldings generally have inadequate thermal properties and inadequate moisture adsorption that limit their use as epoxy moldings.

Historically, encapsulants for the electronic industry have been formulated from diepoxies and a co-reactant (or hardener) consisting of either acid dianhydride, diamine or diphenol oligomers. More recently the diphenol oligomers have been preferred over the dianhydride oligomers and diamine oligomers because they lead to a product with higher reliability than the other two co-reactants. The most common diphenol oligomers are derived from novolac phenols, cresol phenols and bis-phenol-A. To this resin mix are added other ingredients including fillers, pigments, fire retardants, catalysts and processing aids.

Unfortunately, epoxy-hardener resin systems adsorb water. The presence of water in an electronic encapsulant can create tremendous stresses in the electronic package if the package is exposed quickly to temperatures above 100° C. causing the package to delaminate or "popcorn." The most common time during which an electronic package is exposed to elevated temperatures is while the package travels through solder reflow. To minimize the stresses that the package encounters at elevated temperatures it is desirable that the encapsulant have low moisture adsorption and a glass transition temperature as high as possible. A high glass transition temperature will minimize the stresses caused strictly by temperature changes. Within the epoxy resin systems, the way to improve the glass transition temperature is to increase the crosslink density. However, increasing the crosslink density generally leads to an increase in the moisture adsorption. Therefore, the formulator is constantly balancing the glass transition temperature against the desired moisture adsorption level in the resin. The use of polybenzoxazine as the phenolic hardener allows for low moisture adsorption level without compromising the glass transition temperature.

SUMMARY OF THE INVENTION

In order to alleviate the inherent problems in prior art epoxy molding compounds, the present invention provides an epoxy molding compound that employs polybenzoxazines as the co-reactant of one or several epoxy resins. Use of polybenzoxazines lead to a product with reduced moisture adsorption and a high glass transition temperature (Tg). The epoxy molding compounds of the present invention having polybenzoxazines as an ingredient meet new solder reflow conditions (85% RH/85° C., 240°), which are presently used in the industry. The JEDEC (Joint Electron Device Engineering Council) recommends a series of package moisturization conditions to simulate actual work environment conditions. These tests are performed under accelerated conditions to minimize testing time. For instance, JEDEC level 1 is conditioning the samples at 85° C. at 85% relative humidity for 168 hours. This condition simulates a work environment of 30° C. and 90% relative humidity, and indicates that no special handling is required for the package. The JEDEC level 2 condition is 85° C. and 60% relative humidity for 168 hours simulating 30° C. and 60% relative humidity. Level 2 conditions indicate that the part can be exposed to ambient for as long as one year. Level 3 conditions are 30° C., 60% relative humidity for 192 hours. Level 3 conditions means that the part can sit in an air-conditioned factory for one week. These conditions are intended to be accelerated tests which reflect in-use or on-the-floor conditions.

The real test for parts exposed to these accelerated conditions is for them to be run through solder reflow conditions after conditioning. Failure is determined if the part shows any external cracks, if it bulges or if it loses electrical continuity. Scanning acoustic microscopy has been used to determine delamination, but there is no clear evidence that this delamination leads to product failure. Reflow conditioning has traditionally been at 215° C.–220° C. However, with the recent push for solder having no lead in its formulation, the reflow temperature requirements have climbed to 240° C. and are expected to rise to 260° C. The standard epoxy encapsulants have not been able to pass these new temperature standards. With a 30% reduction in the moisture adsorption when using polybenzoxazines as the co-reactant, these new standards have been met.

The novel epoxy molding compounds of the present invention are thus suitable for use in encapsulating a microchip or semiconductor device.

The above description sets forth rather broadly the more important features of the present invention in order that the detailed description thereof that follows may be understood, and in order that the present contributions to the art may be better appreciated. Other objects and features of the present invention will become apparent from the following detailed description considered in conjunction with the accompanying drawings. It is to be understood, however, that the drawings are designed solely for the purposes of illustration and not as a definition of the limits of the invention, for which reference should be made to the appended claims.

DETAILED DESCRIPTION OF THE INVENTION

The novel epoxy molding compound of the present invention advantageously comprises as its base formulation, silica filler, hardeners, silane coupling agents, processing oils and waxes, flame retardant materials, one or more fillers and one or more pigments and dyes. Preferably, silica filler is provided in the range 60–90% of the formulation, and may comprise angular or spherical silica or both. Advantageously, the lowest viscosity of product would result from a mixture of spherical silicas. Both fused or crystalline silica could also be used. Average particle size of the fillers range from 0.5 microns to 40 microns. In the preferred embodiment of the present invention, an optimized ratio of several fillers is used. Other fillers such as glass, mica, wollastonite, clay, talc, alumina and other inorganic materials may be used.

The epoxy resin is preferably in the range of 5–30% of the formulation, and preferably selected from, but not limited to, diglycidyl ether of bisphenol A, diglycidyl ether of bisphenol F, triglycidyl ether of triphenolmethane, polyglycidyl ether of novolac, polyglycidyl ether cresol novolacs, polyglycidyl ether of naphthalenic phenols, and methyl, ethyl, propyl and butyl substituted versions of these resins. More preferably, the epoxy resin is in the range of 4–10% of the total compound.

Hardeners are preferably in the range of 0–30%, and may include but are not limited to polyphenols, polycresol phenols, naphthalenic phenols, polybis-phenol A, polybisphenol F, poly(triphenolmethane) and methyl, ethyl, propyl and butyl substituted versions of these resins. More preferably, the hardener is in the range of 0–5% of the total compound.

The polybenzoxazines in accordance with the present invention are prepared from di- or mult-functional phenols such as bisphenol-A, bisphenol-F, novolac oligomers, cresol oligomers and multifunctional phenolic oligomers such as triphenolmethane and tetraphenolethane; formaldehyde; and primary amines such as methylamine, ethylamine, propylamine, butylamine, isobutylamine, hexylamine, aniline, benzylamine, and cyclohexylamine. The polybenzoxazines are in the range of 2–30% and more preferably in the range of 4–10% of the total compound.

The silane coupling agents are present in the range of 0–2% silane and are preferably glycidoxypropyltrimethoxysilane, glycidoxypropyltriethoxysilane, aminopropyltriethoxysilane, aminopropyltrimethoxysilane, vinlytriethoxysilane, vinlytrimethoxysilane, acryloxypropyltriethoxysilane, acryloxypropyltrimethoxysilane, ureidopropyltriethoxysilane, ueidopropyltrimethoxysilane, mercaptopropyltriethoxysilane, mercaptopropyltrimethoxysilane.

Processing oils and waxes such as silicone oils and rubbers, fatty acids, salts and esters, polypropylene waxes, polyethylene waxes, natural waxes such as carnauba wax, palm oils, and other vegetable oils and waxes are also used. The processing oils and waxes are preferably in the range of 0–5%.

Flame retardant materials, such as brominated epoxies, brominated phenolics, antimony oxides, zinc molybdates, zinc borates, magnesium hydroxide, aluminum hydroxide, polyphosphoric acid, red phosphorus, aromatic phosphates are provided in the range of 0–10%.

Pigment or dye is provided in the range of 0–5% and may include carbon black, nigrosine, lampblack and furnace black.

Catalysts including tertiary amines, substituted phosphines, imidazoles, Lewis acids and, Lewis bases and salts, adipic acid, ureas salts are present in the range of 0–5%. More preferably, the catalyst is in the range of 0.05–0.50% of the total compound. Standard catalysts such as benzyldimethylamine and triphenyl phosphine will not efficiently catalyze the reaction of polybenzoxazines with epoxy resins. More reactive catalysts such as imidazoles and amines and phosphines containing an electron withdrawing group are required. Several catalysts that show some catalytic behavior are benzamidazole, 2-methylimidazole, 2-phenylimidazole, 4-dimethylaminopyridine, adipic acid, and tris(2,6-dimethoxyphenol)phosphine. This list by no means should be considered as exhaustive, but merely representative.

The invention is not limited, however, in the percentage amounts of the ingredients in the base formulation.

The novel epoxy molding formulations are uniquely effective in that they provide an epoxy molding compound having reduced moisture adsorption and a high glass transition temperature.

In formulating and preparing the base formulation, the ingredients are blended in a high speed mixer until the material is a homogeneous, fine powder. A temperature is maintained in the blender below 26° C. so that the material does not sinter. This blend is then melt blended in a twin screw extruder at a processing temperature of around 100° C.±5° C., consolidated into a flat sheet and granulated. The processed material is stored at 5° C. until further processed.

The specific preferred polybenzoxazine in accordance with the present invention, is prepared from bisphenol-A, aniline and formaldehyde. This oligomeric benzoxazine gives a relatively high hydroxyl number or hydroxyl equivalent weight. High hydroxyl numbers in phenolic/epoxy copolymers generally offers low water adsorption. The unique property of the benzoxazine system is that this high hydroxyl number does not lower the glass transition temperature of the polymer. In most phenolic compounds a high hydroxyl equivalent weight leads to low glass transition temperatures. A high glass transition temperature is preferred in electronic molding compounds since this type of compound is expected to introduce less thermal stresses in the package during thermal cycling (e.g. during reflow soldering). Polybenzoxazines also ring open during polymerization. This ring-opening phenomenon reduces the polymerization shrinkage that in turn should lead to less stress on the part. On the negative side, polybenzoxazines react with epoxy resins at a much slower rate than the standard phenolic resins. Therefore, different catalysts have been developed for the polybenzoxazine system. Also, the lower mold shrinkage can often lead to demolding issues since the cured part will not shrink away from the mold. Both of these processing issues have been addressed and resolved in accordance with the composition of this invention.

In a preferred embodiment in accordance with the present invention, the base formulation of the epoxy molding compound comprises the following:

| Base formulation | |
|---|---|
| spherical, fused silica (32 microns) | 31.0% (filler) |
| angular, fused silica (15 microns) | 31.0% (filler) |
| spherical, fused silica (0.5 microns) | 15.5% (filler) |
| glycidoxypropyltriethoxysilane | 0.7% (coupling agent) |
| dimethylsilicone rubber | 1.5% (processing aid) |
| polyglycidyl ether of triphenolmethane | 7.2% (epoxy) |
| polytriphenol methane | 0.6% (hardener) |
| polybenzoxazine | 8.6% (hardener) |
| antimony oxide | 1.1% (fire retardant) |
| tetrabromobisphenol A | 1.6% (fire retardant) |
| carbon black | 0.4% (pigment) |
| stearic acid ester | 0.2% (processing aid) |
| stearic acid | 0.2% (processing aid) |
| imidazole catalyst | 0.1% (catalyst) |

Example #1. Commercial epoxy molding compound ("EMC") containing a multifunctional epoxy and a multifunctional hardener.

Example #2. EMC having polybenzoxazine hardener and multifunctional epoxy with an imidazole catalyst Example #3. EM having polybenzoxazine hardener and multifunctional epoxy with 4-dimethylaminopyridine as catalyst Example #4. EMC having polybenzoxazine hardener and diglycidyl epoxy of bisphenol-A (imidazole catalyst)

Example #5. EMC having polybenzoxazine hardener and diglycidyl epoxy of a naphthalenic diphenol (imidazole catalyst)

Example #6. EMC having polybenzoxazine and multifunctional hardener blended at a 1:1 equivalent ratio and a multifunctional epoxy resin Example #7. EMC having polybenzoxazine and multifunctional hardener blended at a 3:1 equivalent ratio and a multifunctional epoxy resin Example #8. EMC having polybenzoxazine and multifunctional hardener blended at a 5.67:1 equivalent ratio and a multifunctional epoxy resin Example #9. EMC having polybenzoxazine and multifunctional hardener blended at a 9:1 equivalent ratio and a multifunctional epoxy resin

TABLE I

Property data for epoxy molding compounds containing polybenzoxazines.

| | Comparative example #1 | Example #2 | Example #3 | Example #4 | Example #5 |
|---|---|---|---|---|---|
| Ash content (%) | 78.8 | 79.1 | 79.4 | 78.8 | 76.4 |
| Coefficient of linear thermal expansion (ppm/° C.) | 16.2 | 14.4 | 14.8 | 16.8 | 16.2 |
| Glass transition temperature (° C.) | 197 | 181 | 156 | 161 | 130 |
| Flexural strength (psi) | 16300 | 16400 | 15500 | 17300 | — |
| Flexural modulus (Mpsi) | 2.58 | 2.73 | 2.66 | 2.97 | — |
| Viscosity (poise) | 112 | 120 | 93 | 161 | 130 |
| Spiral flow (in) | 24.5 | 25.0 | 23.5 | 30.8 | 48.3 |
| Ram follower gel time (sec) | 10.3 | 11.2 | 9.7 | 14.2 | 21.4 |
| Water adsorption (85% RH/ 85° C., 7 days) (%) | 0.60 | 0.42 | 0.44 | 0.30 | 0.29 |

TABLE II

Property data for epoxy molding compounds containing polybenzoxazines.

| | Comparative example #1 | Example #6 | Example #7 | Example #8 | Example #9 |
|---|---|---|---|---|---|
| Ash content (%) | 78.8 | 78.3 | 79.1 | 78.8 | 78.9 |
| Coefficient of linear thermal expansion (ppm/° C.) | 16.2 | 20.5 | 16.2 | 15.7 | 15.1 |
| Glass transition temperature (° C.) | 197 | 173 | 182 | 182 | 156 |
| Flexural strength (psi) | 16300 | 17100 | 17900 | 15600 | — |
| Flexural modulus (ksi) | 2.58 | 2.35 | 3.23 | 3.25 | — |
| Viscosity (poise) | 112 | 90 | 129 | 101 | 156 |
| Spiral flow (in) | 24.5 | 32.2 | 24.0 | 31.2 | 31.8 |
| Ram follower gel time (sec) | 10.3 | 10.0 | 15.2 | 17.8 | 19.1 |
| Water adsorption (85% RH/ 85° C., 7 days) (%) | 0.60 | 0.34 | 0.30 | 0.30 | 0.31 |

Examples #2 and #3 were used to encapsulate a 27 mm×27 mm Ball Grid 5 Array package containing a 10 mm square die. These packages were conditioned under Level 1 conditions (85%RM/85° C. for 7 days). The packages were then run through a 240° C. solder reflow cycle twice. The packages were then evaluated using the Scanning Acoustic Microscope (SAM) for delamination and voids. Voids were observed but they were located under the die where there was no molding compound. By physically peeling the substrate away from the molding compound it was shown that adhesive failure occurred in the substrate and not at the molding compound—substrate interface. The adhesion of the molding compound to the die surface was also shown to be very good. Thus, it appears that conditioning the package under level 1 conditions and exposing this package to 240° C. does not adversely affect the adhesion.

Tables I and II show a reduction in the water adsorption of 30%–50% for the polybenzoxazine-containing examples over the control (Example #1). This reduction is accompanied by a reduction in the glass transition temperature of about 20° C. This 180° C. glass transition temperature is still considerably higher than most epoxy 20 molding compounds. The other properties shown in the tables are comparable to the control.

Examples #2 and #3 compare the use of two different catalysts, 2-methylimidazole (#2) and 4-dimethylaminopyridine (#3). The imidazole gave the higher glass transition temperature and is slightly preferred in this application. Replacing a multifunctional epoxy with a linear difunctional epoxy (examples #4 and #5) reduces the glass transition temperature. As mentioned above, this loss in the glass transition temperature was expected with the use of conventional epoxies.

Examples #6–#9 are cases where different levels of a multifunctional hardener replace some of the polybenzoxazine hardener on an equivalent basis. These variations were explored in order to improve the processability of the compounds. Note that as much as half of the polybenzoxazine (Example #6) could be replaced without significantly affecting the water adsorptivity or glass transition temperature. These examples also demonstrate the reduced reactivity of the polybenzoxazine hardener. That is, the reactivity as measured by gel time decreases (longer gel time) as the amount of polybenzoxazine increases. This reduced reactivity can be overcome by adding more catalyst to the composition.

The advantages of these polybenzoxazine/epoxy compounds, therefore, include a combination of low moisture adsorption, a high glass transition temperature, low viscosity, good spiral flow and good processability. This unique set of properties have not been matched by any other epoxy molding compound.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. An epoxy molding compound comprising:
   from about 5–30% by weight of an epoxy resin;
   from about 0–30% by weight of a resin hardener;
   from about 60–90% by weight of a filler;
   from 2–10% by weight of polybenzoxazine based on the total weight of the compound composition, and which co-reacts with the epoxy resin; and
   an effective amount of a catalyst for the reaction between the epoxy resin and the polybenzoxazine.

2. The epoxy molding compound of claim 1, wherein the epoxy resin or a combination of two or more epoxy resins, is selected from the group consisting of diglycidyl ether of bisphenol-A, diglycidyl ether of bisphenol-F, polyglycidyl ether of novolac, polyglycidyl ether of cresol novolac, polyglycidyl ether of naphthalenic phenol, polyglycidyl ether of triphenolmethane, diglycidyl ether of biphenol and the methyl, ethyl propyl, butyl, tertiary butyl substituted version of these resins.

3. An epoxy molding compound comprising:
   from about 5–30% by weight of an epoxy resin, wherein the epoxy resin is a triglycidyl ether of triphenolmethane;
   from about 0–30% by weight of a resin hardener;
   from about 60–90% by weight of a filler;
   from about 2–30% by weight of polybenzoxazine based on the total weight of the compound composition, and which co-reacts with the epoxy resin; and
   an effective amount of a catalyst for the reaction between the epoxy resin and the polybenzoxazine.

4. An epoxy molding compound comprising:
   from about 5–30% by weight of an epoxy resin;
   from about 0–30% by weight of a resin hardener, wherein the resin hardener or a combination of two or more resin hardeners, is selected from the group consisting of polyphenols, polycresol phenols, naphthalenic phenols, polybisphenol A, polybisphenol F, poly(triphenolmethane) and methyl, ethyl, propyl and butyl substituted versions of these resins;
   from about 60–90% by weight of a filler;
   from about 2–30% by weight of polybenzoxazine based on the total weight of the compound composition, and which co-reacts with the epoxy resin; and
   an effective amount of a catalyst for the reaction between the epoxy resin and the polybenzoxazine.

5. An epoxy molding compound comprising:
   from about 5–30% by weight of an epoxy resin;
   from about 0–30% by weight of a resin hardener, wherein the resin hardener is a triphenolmethane oligomer;
   from about 60–90% by weight of a filler;
   from about 2–30% by weight of polybenzoxazine based on the total weight of the compound composition, and which co-reacts with the epoxy resin; and
   an effective amount of a catalyst for the reaction between the epoxy resin and the polybenzoxazine.

6. The epoxy molding compound of claim 1, wherein the filler is silica filler.

7. The epoxy molding compound of claim 6, wherein the silica filler is comprised of spherical, angular and fused silica and combinations thereof.

8. The epoxy molding compound of claim 6, wherein the silica filler comprises particles in the range from 0.5 to 40 microns in size.

9. The epoxy molding compound of claim 1, wherein the polybenzoxazines is comprised of bisphenol-A, aniline and formaldehyde.

10. The epoxy molding compound of claim 1, wherein the catalyst is present at less than 15% by weight based on the total weight of the compound composition.

11. The epoxy molding compound of claim 10, wherein the catalyst or a combination of two or more catalysts is selected from the group consisting of imidazoles, amines and phosphines.

12. An epoxy molding compound comprising:
    from about 5–30% by weight of an epoxy resin;
    from about 0–30% by weight of a resin hardener;
    from about 60–90% by weight of a filler;
    from about 2–30% by weight of polybenzoxazine based on the total weight of the compound composition, and which co-reacts with the epoxy resin; and
    an effective amount, but less than 15% by weight, of a catalyst for the reaction between the epoxy resin and the polybenzoxazine, wherein the catalyst or a combination of two or more catalysts is selected from the group consisting of benzimidazole, 2-methylimidazole, 2-phenylimidazole, 4-dimethylaminopyridine, adipic acid and tris(2,6-dimethoxyphenol)phosphine.

13. The epoxy molding compound of claim 1, further comprising from about 0–2% by weight of a silane coupling agent.

14. The epoxy molding compound of claim 13, wherein the silane coupling or a combination of two or more silane coupling agents is selected from the group consisting of glycidoxypropyltrimethoxysilane, glycidoxypropyltriethoxysilane, aminopropyltriethoxysilane, aminopropyltrimethoxysilane, vinlytriethoxysilane, vinlytrimethoxysilane, acryloxypropyltriethoxysilane, acryloxypropyltrimethoxysilane, ureidopropyltriethoxysilane, ueidopropyltrimethoxysilane, mercaptopropyltriethoxysilane, and mercaptopropyltrimethoxysilane.

15. The epoxy molding compound of claim 14, wherein the silane coupling agent is glycidoxypropyltrimethoxysilane.

16. The epoxy molding compound of claim 1 further comprising from about 0–5% by weight of a processing aid.

17. The epoxy molding compound of claim 16, wherein the processing aid may comprise one or more oils and waxes.

18. The epoxy molding compound of claim 17, wherein the processing aid is stearic acid.

19. The epoxy molding compound of claim 1, further comprising from about 0–10% by weight of a flame retardant material.

20. The epoxy molding compound of claim 19, wherein the flame retardant material or a combination of two or more flame retardant materials is selected from the group consisting of brominated epoxies, brominated phenolics, antimony oxides, zinc molybdates, zinc borates, magnesium hydroxide, aluminum hydroxide, polyphosphoric acid, red phosphorus and aromatic phosphates.

21. The epoxy molding compound of claim 1, further comprising from about 0–5% by weight of pigment or dye.

22. The epoxy molding compound of claim 21, wherein the pigment or dye is selected from the group consisting of carbon black, nigrosine, lamp black and furnace black.

23. An epoxy molding compound comprising:
   from about 5–30% by weight of an epoxy resin comprising triglycidyl ether of triphenolmethane;
   from about 0–30% by weight of a resin hardener comprising a triphenol methane;
   from about 60–90% by weight of a fused silica filler;
   from about 2–30% by weight of polybenzoxazine, which co-reacts with the epoxy resin;
   from about 0–2% by weight of a silane coupling agent;
   from about 0–5% by weight of a processing aid;
   from about 0–10% by weight of a flame retardant material;
   from about 0–5% by weight of pigment or dye; and
   from about 0–15% by weight of an imidazole catalyst for the reaction between the epoxy resin and the polybenzoxazine, all of the foregoing being based on the total weight of the composition.

24. An epoxy molding compound having decreased moisture adsorption and a high glass transition temperature, which comprises:
   7.2% by weight of an epoxy resin;
   0.6% by weight of a resin hardener;
   77.5% by weight of silica fillers;
   8.6% by weight of polybenzoxazine based on the total weight of the compound composition, and Which co-reacts with the epoxy resin; and
   0.1% by weight of a catalyst for the reaction between the epoxy resin, hardener and the polybenzoxazine.

25. The epoxy molding compound of claim 23, wherein the polybenzoxazine forms 4–10% by weight of the compound.

* * * * *